United States Patent [19]
Lucas et al.

[11] Patent Number: 5,994,909
[45] Date of Patent: Nov. 30, 1999

[54] ROBOTIC TWIN PROBE FOR MEASUREMENT ON PRINTED CIRCUIT BOARDS AND ELECTRICAL AND ELECTRONIC ASSEMBLIES

[76] Inventors: Brian K. Lucas, Ivy Lodge, The Hayes, Cheddar, Somerset; Eric D. Collingbourne, 67 North Street, Downend, Bristol, both of United Kingdom, BS165SF

[21] Appl. No.: 08/958,747

[22] Filed: Oct. 31, 1997

Related U.S. Application Data

[60] Provisional application No. 60/056,972, Aug. 25, 1997.

[51] Int. Cl.⁶ ..................................................... G01R 1/06
[52] U.S. Cl. ............................................................ 324/754
[58] Field of Search ..................... 324/754, 761, 324/72.5, 757–758; 439/482, 824; 901/44, 47, 4; 73/866.5

[56] References Cited

U.S. PATENT DOCUMENTS

| 3,727,119 | 4/1973 | Stanley et al. ............................. 901/44 |
| 4,881,177 | 11/1989 | McClean et al. ........................ 901/44 |
| 5,006,793 | 4/1991 | Gleason . |
| 5,264,788 | 11/1993 | Smith . |
| 5,473,254 | 12/1995 | Asar ......................................... 324/754 |
| 5,550,844 | 8/1996 | Lucas ....................................... 371/22.6 |

FOREIGN PATENT DOCUMENTS

| 0 468 153 A1 | 1/1992 | European Pat. Off. . |
| 2 605 414 | 4/1988 | France . |
| 09005357 | 10/1997 | Japan . |

OTHER PUBLICATIONS

IBM Technical Disclosure Bulletin, "Probe Collision Avoidance Procedure for Parametric Testers", vol. 32 (No. 8B), pp. 438–442, (Jan. 1, 1990).

M. Takahashi, "Manufacturers Consider Fixtureless In–Circuit Testers", JEE Journal of Electronic Engineering, vol. 27 (No. 287), pp. 58–64, (Nov. 1, 1990).

*Primary Examiner*—Vinh P. Nguyen
*Attorney, Agent, or Firm*—Duft, Graziano & Forest P.C.

[57] ABSTRACT

An automated system and method for testing circuitry utilizes robotics to place probe leads at selected points on a circuit board with extreme precision. The robotics includes motors and associated control software. The control software can process user input and direct the motors to place the probe leads. The control software also directs the probe to perform the testing and provides the test results to the user. Three motors position the probe leads as directed by the control software. The motors utilize a polar coordinate positioning system. A rotational motor positions a second probe lead in a rotational direction relative to a first probe lead. A radial motor positions the second probe lead in a radial direction relative to the first probe lead. A Z-direction motor positions both probe leads in a Z-direction relative to the circuitry and engages the probe leads with the circuitry.

32 Claims, 6 Drawing Sheets

ROBOTIC TWIN PROBE FOR MEASUREMENT ON PRINTED CIRCUIT BOARDS AND ELECTRICAL AND ELECTRONIC ASSEMBLIES

RELATED APPLICATIONS

This application references provisional application Ser. No. 60/056972 filed Aug. 25, 1997.

FIELD OF THE INVENTION

The invention pertains to systems for testing circuitry and, in particular, for testing circuitry with the use of robotics to position probe leads through a polar coordinate positioning technique.

PROBLEM

There is a great demand for computers and other electronic devices having higher speeds and increased capacity. The circuitry within these devices has become increasingly complex to permit high speed operations. Complex circuitry can be implemented on printed circuit boards that have minimal spacing between the various circuits and components resident on the board. Complex circuit boards are tested by manually placing probe leads at pre-defined points on the board to assess the signal integrity.

The high density of circuitry on a board poses a major challenge to manual testing. High circuit density may require the test engineers to use microscopes to manually place the probe leads on the board. Small pins may need to be soldered to the probe leads for finer precision placement on the board. There is little room for error when placing probe leads in this environment. Awkward mechanical probe holders are often required to ensure that the probe leads do not move from their test points once they are so painstakingly positioned. Despite such efforts, circuit board test results often contain errors due to corresponding probe misalignment.

The high speed operation of modern circuitry causes additional problems. High operating frequencies impose tight restrictions on test equipment because high frequency signals degrade quickly over test leads due to system impedance. Current manual testing techniques that require long probe leads can cause severe signal degradation.

Manual testing also requires that trained engineers be present to perform the tests. This requirement drives up the cost of the testing. It also hinders the effective use of remote testing because test engineers must be on-site with the test equipment. The test engineers cannot direct placement of the probe leads and view test results from a remote location.

Manual testing techniques are costly, time-consuming, and error-prone given the complexity of modern circuitry. There is a distinct need for a testing system that is fast, accurate, and cost-effective.

SOLUTION

The invention overcomes the problems outlined above by providing an automated system and method for testing circuitry. The invention performs testing quickly and accurately, and advantageously allows remote testing in some embodiments. The invention utilizes radial arm robotics to place probe leads at selected points on a circuit board with extreme precision. The robotic placement of twin probe leads on the circuitry allows the leads to be as short as possible and minimizes the impedance and inductance associated with the probe leads. System reliability is enhanced by the rotational/radial positioning of the probe leads, as opposed to X-Y positioning, because the bobbin leads fatigue less and last longer under repetitive motion strain.

The robotics comprise motors and associated control software. The control software can process user input and direct the motors to place the probe leads. The control software also directs the probe to perform the testing and provides the test results to the user. The motors utilize a polar coordinate positioning system. A rotational motor positions a second probe lead in a rotational direction relative to a first probe lead. A radial motor positions the second probe lead in a radial direction relative to the first probe lead. A Z-direction motor positions both probe leads in a Z-direction relative to the circuitry and engages the probe leads with the circuitry.

In some embodiments, the invention provides for remote testing of printed circuit boards. A remote terminal is used to display a diagram of the circuitry to the user. The user may then simply point and click probe placement points and selected tests on the remote terminal display. In response to these user inputs, control software directs the motors to position the probe leads relative to one another and to the circuit board. The control software then directs the probe to conduct the tests. Finally, the control software displays the test results to the user at the remote terminal display.

The invention performs automated testing of complex circuitry. Using the polar coordinate positioning technique, the invention is able to place probe leads at selected probe placement points with extreme precision. In some embodiments, the probe leads are placed within 0.01 inches of the selected probe placement points, and in other embodiments, the probe leads are placed within 0.001 inches of the selected probe placement points. Automation also allows the testing to be performed quickly and accurately without the problems associated with manual testing.

DETAILED DESCRIPTION

Figure 1:
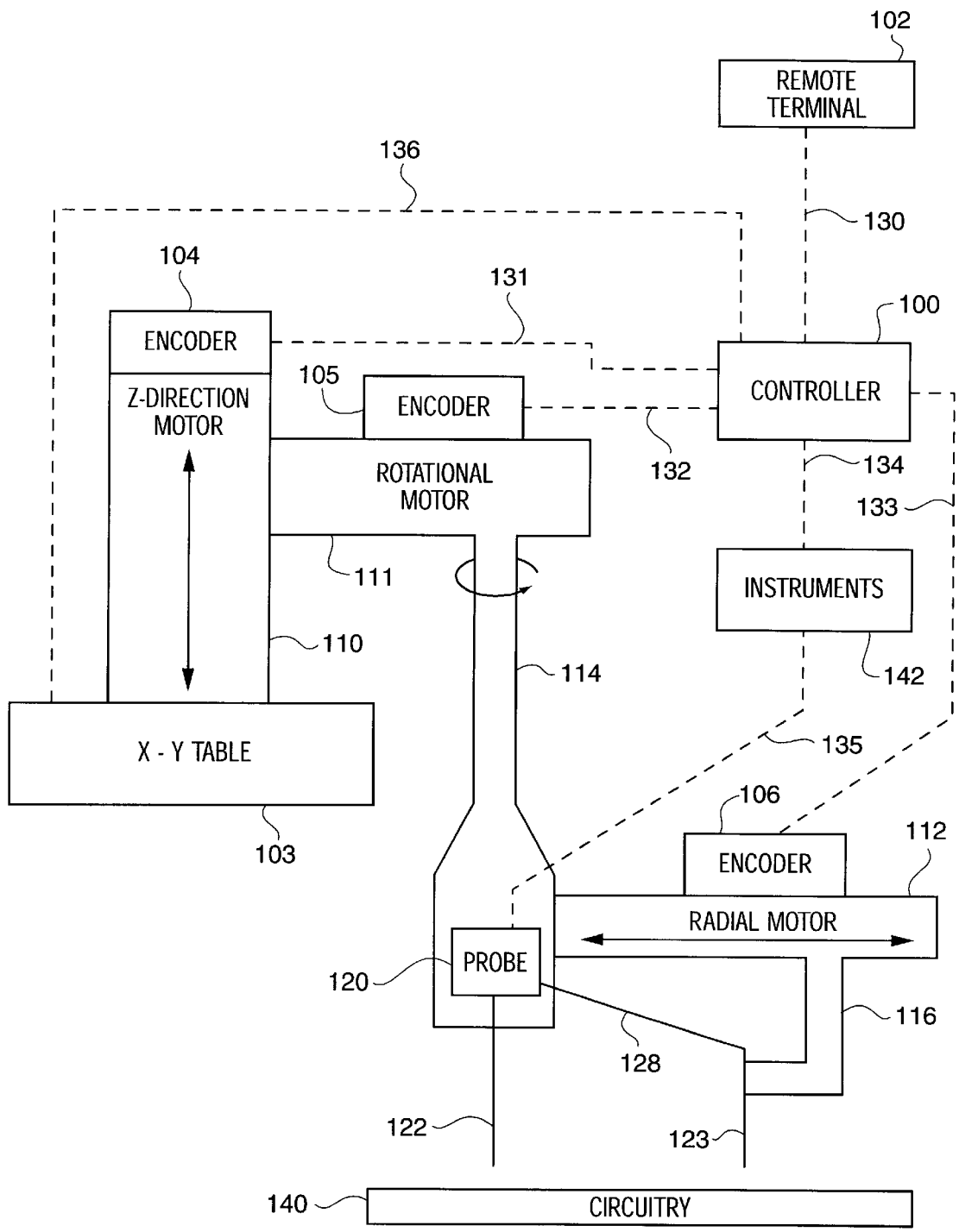
FIG. 1 is a block diagram of a version of the invention.
Figure 2:
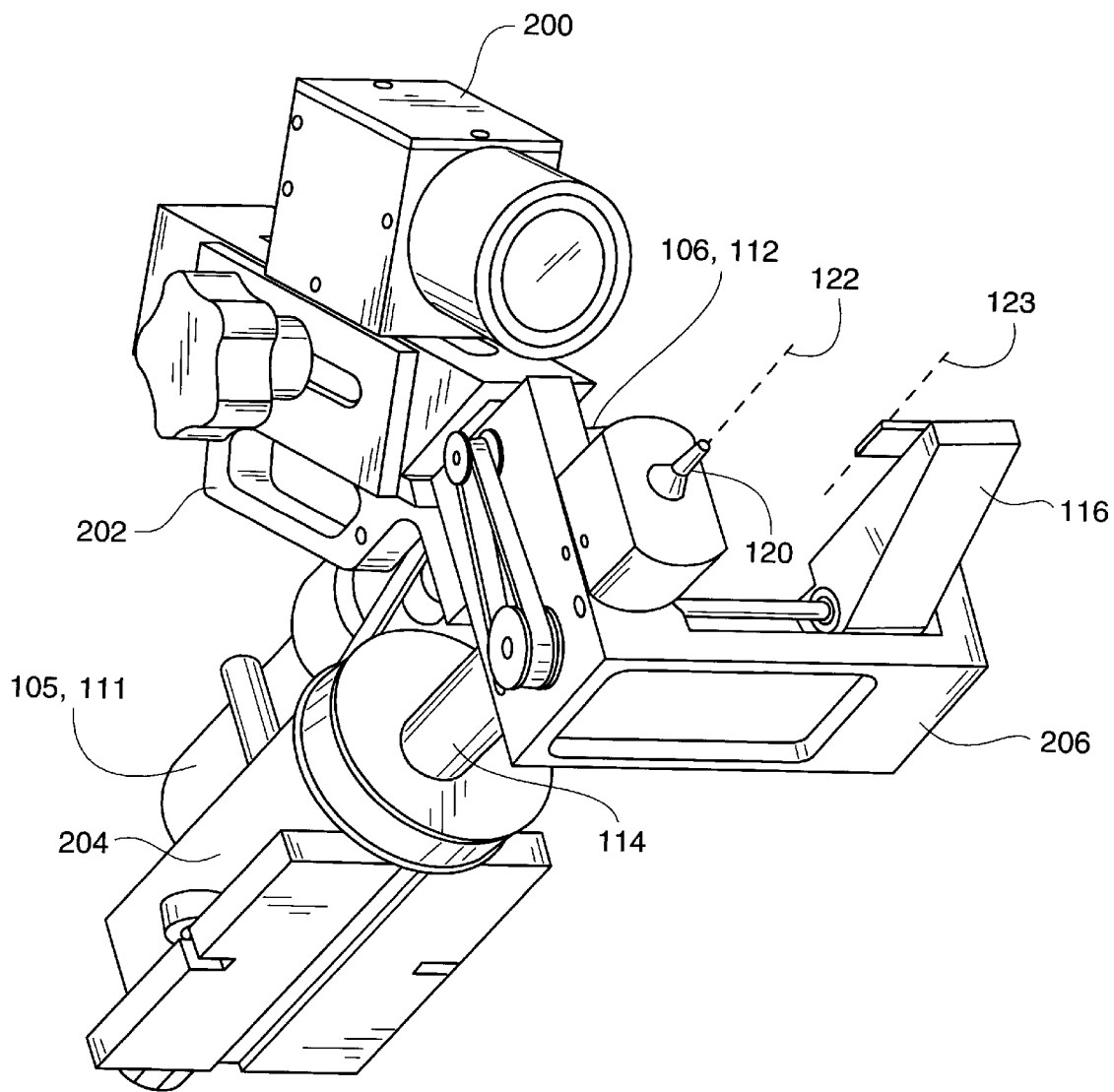
FIG. 2 is a sketch of a version of the invention.

System Architecture—FIGS. 1–2

FIG. 1 is a block diagram of a version of the invention for testing circuitry 140 with the probe leads 122 and 123. In the context of the invention, the surface of the circuitry 140 lies in the X-Y plane of a Cartesian reference system and in the rotational/radial plane of a polar reference system. The surface of the circuitry 140 is perpendicular to the Z-axis of both reference systems.

The encoder 105 and the rotational motor 111 comprise a rotational positioning system that positions the probe lead 123 in a rotational direction relative to the probe lead 122 responsive to a rotational control signal from the controller 100. The encoder 106 and the radial motor 112 comprise a radial positioning system that positions the probe lead 123 in a radial direction relative to the probe lead 122 responsive to a radial control signal from the controller 100. The encoder 104 and the Z-direction motor 110 comprise a Z-direction positioning system that positions the probe lead 122 and the probe lead 123 in a Z-direction relative to the circuitry 140 responsive to a Z-direction control signal from the controller 100. The probe 120 conducts testing responsive to a probe control signal from the controller 100. The controller 100 generates the control signals responsive to user input.

The controller 100 is coupled to a remote terminal 102 by a connection 130. The controller 100 is respectively coupled to corresponding encoders 104, 105, and 106 by connections 131, 132, and 133. The controller 100 is coupled to instruments 142 by a connection 134, and the instruments 142 are coupled to a probe 120 by a connection 135. The controller 100 is also coupled to an X-Y table 103 by a connection 136. The connection 128 operationally couples the probe lead 123 to the probe 120.

The X-Y table 103 is coupled to the Z-direction motor 110. The encoders 104–106 are respectively coupled to motors 110, 111, and 112. The Z-direction motor 110 is coupled to the rotational motor 111. The rotational motor 111 includes shaft 114 and is coupled to the radial motor 112. The probe lead 122 is co-axial with the shaft 114. Radial motor 112 includes carriage 116, and the carriage 116 is coupled to probe lead 123. The radial motor 112 carries the probe lead 123. The probe 120 has a probe lead 122 and is centrally coupled to the interior of the shaft 114. The probe lead 122 is coextensive with the rotational axis of the shaft 114.

The circuitry 140 is shown under the probe leads 122 and 123. The circuitry 140 could be any circuitry that can be tested with a probe. One example of such circuitry is a printed circuit board. Printed circuit boards are commonly found in computers and other electronic devices. Some examples of testing for the circuitry 140 are: automated hardware design verification, analog simulator verification, SPICE model validation, IBIS model validation, automated design surveys, time domain reflectometry, differential, fault injection, and signal integrity.

U.S. Pat. No. 5,550,844 discloses a fault injection test circuit for testing printed circuit boards in a fully powered-up, operational condition. U.S. Pat. No. 5,550,844 is hereby incorporated by reference into this application.

SPICE and IBIS systems are well known technologies for modeling circuit boards. These systems have the capability to accept test data in comparision with an electronic model. The invention interacts with this conventional data transfer format. For SPICE model verification, the parametric results of the prototype design are electrically centered to assure that the prototype is within the margins specified by the simulation results.

Probe 120 and associated probe leads 122–123 could comprise any device that is capable of testing circuitry. Some examples of such probes are active FET probes, differential probes, time domain reflectrometry probes, RF probes, and shorting probes. If an FET probe is used, it is preferred that the probe lead 122 represent the measuring tip and the probe lead 123 represent the reference lead. A suitable active FET probe is the 54701A provided by Hewlett Packard. A suitable differential probe is the 1141A provided by Hewlett Packard. A suitable time domain reflectrometry probe is the P6150 provided by Tektronix. A suitable RF probe is the 85024A provided by Hewlett Packard. The probe leads should remain as short as possible to minimize inductance and capacitance. Preferably, the probe leads 122–123 are comprised of pogo pins. Pogo pins allow the probe leads to remain firmly pressed against the circuitry 140 after they are engaged. Connection 128 is typically a bar and wiper comprised of a highly conductive material such as gold or aluminum, but it could be any control coupling that allows the probe leads 122–123 to interact.

The X-Y table 103 is coupled to the Z-direction motor 110 and comprises an X-Y direction positioning system that positions the probe leads 122–123 in an X-Y direction relative to the circuitry responsive to an X-Y control signal from the controller 100. The rotational motor 111 rotates the radial motor 112 around the shaft 114 to concurrently rotate the probe lead 123 with respect to the probe lead 122. The radial motor 112 moves the probe lead 123 in a radial direction relative the probe lead 122 and the shaft 114. The radial direction means directed toward or away from the central axis of the shaft 114, much like a spoke on a wheel. The Z-direction motor moves the probe leads 122–123 in a Z-direction relative to the rotational and radial directions. Preferably, the Z-direction motor 110 moves the rotational motor 111 up or down in a direction parallel to the central axis of the shaft 114 to engage the probe leads 122–123 with the circuitry 140.

The X-Y table 103 is a conventional device known to those skilled in the art. A suitable rotational motor 111 is the 118733 model provided by Maxon of Kansas City, Mo. A suitable radial motor 112 is the S372-1A/T provided by Electrocraft of Clearwater, Fla. A suitable Z-direction motor 111 is the S240 model provided by Electrocraft.

The encoders 104–106 control the action of their associated motors 110–112 in response to control signals from the controller 100. The encoder 104 responds to a Z-direction control signal. The encoder 105 responds to a rotational control signal. The encoder 106 responds to a radial control signal. A suitable encoder 104 is the RM21-10000-8-5VLD provided by Renco. A suitable encoder 105 is the RM15-100-5-5VLD provided by Renco. A suitable encoder 106 is the T___E.15 provided by Maxon. Those skilled in the art appreciate that the encoders 104–106 could be incorporated into their respective motors 110–112 or incorporated into the controller 100.

The controller 100 generates and provides control signals in response to user input. The control signals cause the X-Y table to position the probe leads 122–123 relative to the circuitry 140. The control signals cause the motors 110–112 to properly position the probe leads 122–123 relative to each other and the circuitry 140. The control signals cause the probe 120 to perform the desired testing. The controller 100 could be a personal computer that is programmed in accord with the invention. The connections 130–136 could be any control links that are capable of transporting the control signals. Typically, connections 131–136 are wires. Those skilled in the art are familiar with various ways to provide connection 130, such as an encrypted internet session, data link, or modem connection.

The remote terminal 102 collects user inputs and provides them to the controller 100. The remote terminal 102 could be a personal computer with display that is programmed in accord with the invention. Preferably, the remote terminal 102 displays a CAD map of the circuitry 140 and a list of tests. The remote terminal 102 then allows the user to select the desired probe placement points and tests by pointing and clicking on the display with a mouse. The user input is then provided to the controller 100 over the connection 130. In some embodiments, the remote terminal 102 can also display test results. One example of a display format for test results is the use of waveforms. Those skilled in the art appreciate that the remote terminal 102 is only required for remote testing, and that the user input function and/or the display function could be integrated into the controller 100 if remote testing is not desired. The instruments 142 are conventional devices for use with probes. Some examples of the instruments 142 are oscilloscopes and spectrum analyzers. Those skilled in the art will appreciate the use of instruments 142 in the context of the invention.

It should be appreciated that an additional rotational motor/encoder and an additional radial motor/encoder could be could be coupled to the Z-direction motor 110 to position a third probe lead. Depiction of this arrangement is not shown on FIG. 1 for purposes of clarity. The third probe lead could be used to detect a triggering event occurring in the circuitry, and in response to the triggering event, to perform a test with the other two probe leads. Some examples of triggering events would be voltage thresholds, slopes, pulse widths, and series pulse events. Some examples of tests based on triggering events are fault injection and signal capture.

FIG. 2 depicts a sketch of a version of the invention. Some of the same reference numbers are carried over from FIG. 1 and represent the same device. Shown are: rotational motor 105 and encoder 111, radial motor 106 and encoder 112, shaft 114, carriage 116, and probe 120 and associated probe leads 122–123. Also shown on FIG. 2 are a camera 200 and associated mounting 202, bearing and attachment block 204, and single axis mechanism 206. Camera 200 is used to view the circuitry under test and provide a fixed reference point. Mounting 202 and bearing and attachment block 204 are used to mount the rotational and radial positioning systems to the X, Y, and Z positioning systems.

System Operation—FIGS. 1–4

The invention operates as follows in some embodiments, but the invention is not restricted to the following example. The controller 100 receives user input indicating the selected tests and probe placement points. The input could be received from the remote terminal 102 over the connection 130 or input directly into controller 100. The controller 100 processes this input, along with a CAD file for the circuitry 140. The controller generates an X-Y control signal to cause the X-Y table 103 to position the probe leads 122–123 relative to the circuitry 140. The controller 100 then generates control signals for the encoders 104–106. The controller 100 provides the encoder 104 with a Z-direction control signal over the connection 131. The controller 100 provides the encoder 105 with a rotational control signal over the connection 132. The controller 100 provides the encoder 106 with a radial control signal over the connection 133. In response to the control signals, the encoders 104–106 direct their respective motors 110–112 to position the probe leads 122–123. The rotational motor 111 rotates the probe lead 123 relative to the probe lead 122. The radial motor 111 moves the probe lead 123 in a radial direction relative to the probe lead 122. The Z-direction motor 110 moves both of the probe leads 122–123 down to engage the circuitry 140. The controller 100 interfaces with the probe 120 through the instruments 142 to conduct testing and obtain test results. The probe control signals that initiate the tests and the subsequent test results are carried over connections 134–135. The controller 100 can then provide the results to the remote terminal 102 over connection 130 for subsequent display to the user.

Figure 3:
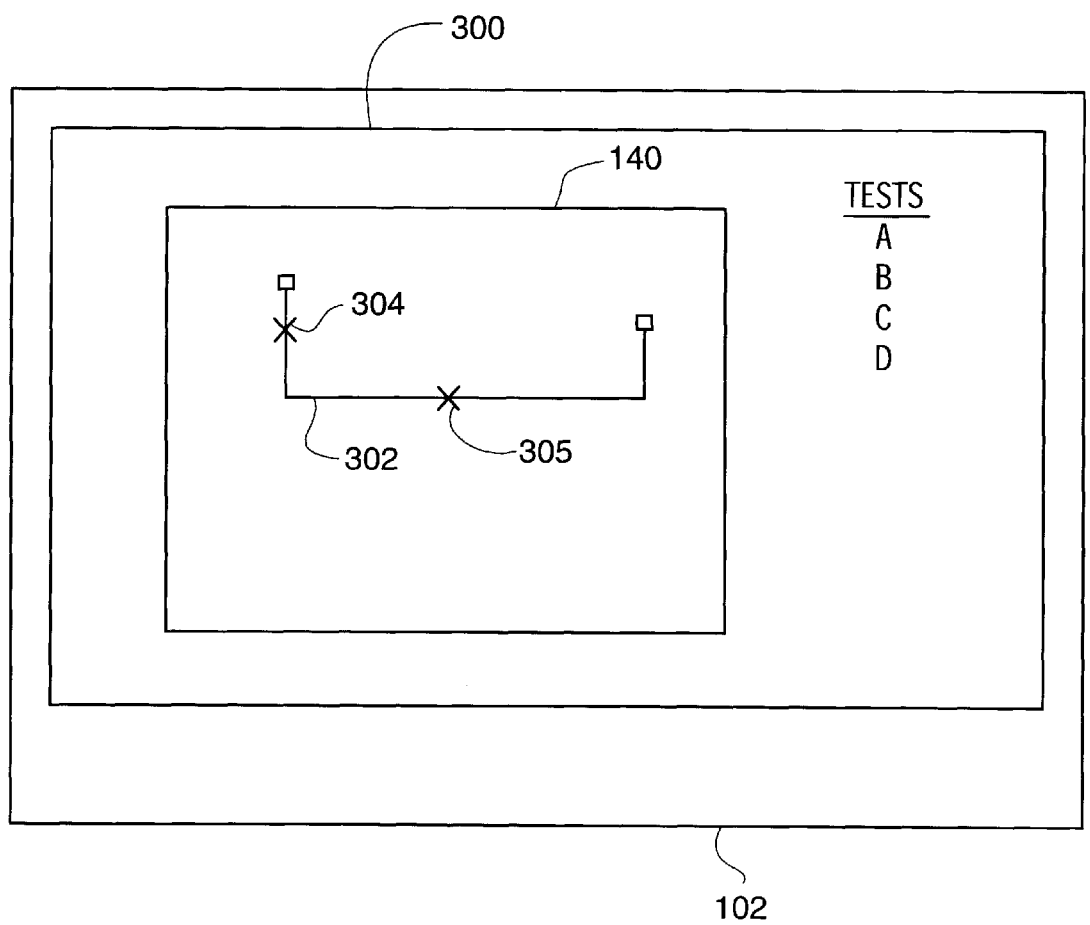
FIG. 3 is a block diagram of a remote terminal display in a version of the invention.

FIG. 3 depicts a remote terminal display for some embodiments of the invention. The remote terminal 102 includes a display 300. The display 300 shows a CAD map of the circuitry 140 including a circuit 302. The display also shows a list of selected tests. Those skilled in the art can appreciate that their are any number of circuits and tests could be shown on the display 300. The user points and clicks selected probe placement points 304–305 on the circuit 302 and the selected tests from the list. The remote terminal 102 then provides these selections to the controller 100 over the connection 130. After the testing, the remote terminal 100 receives the test results from the controller 100 over connection 130 and displays them to the user.

Figure 4:
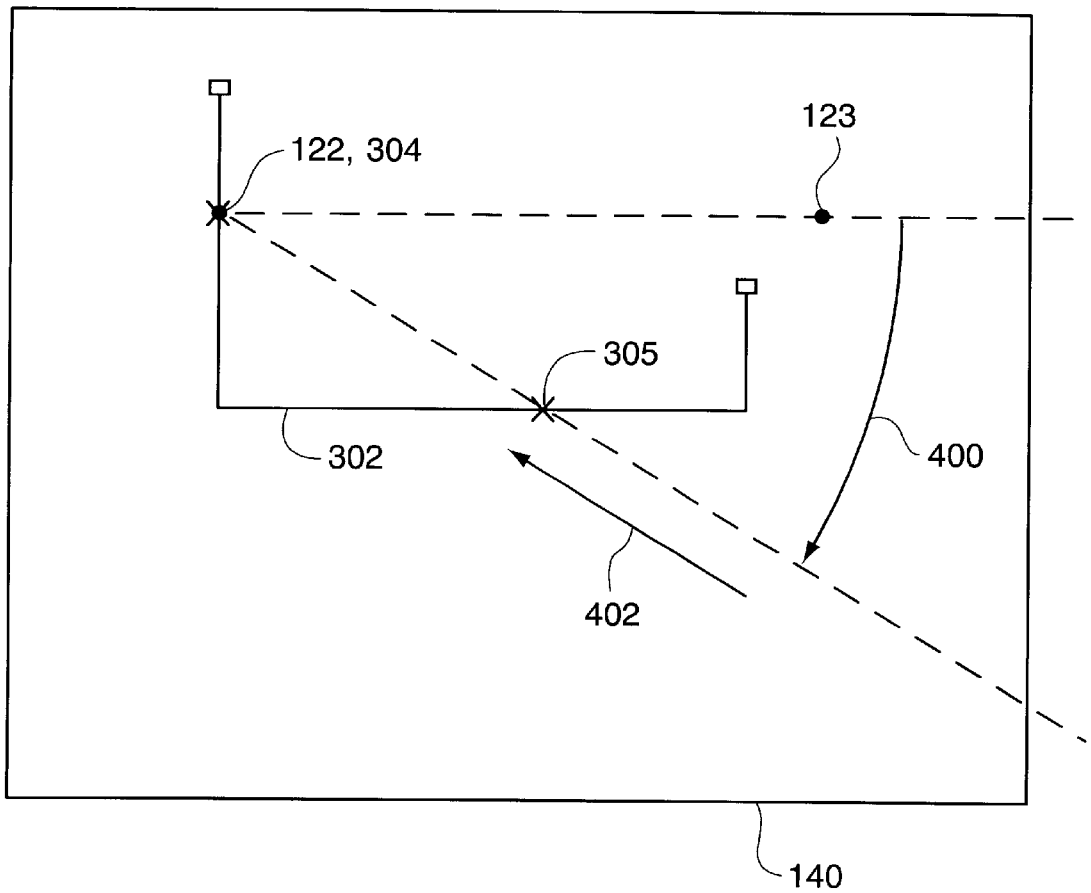
FIG. 4 is a schematic diagram of a circuit board in a version of the invention.

FIG. 4 depicts the polar coordinate technique used by the invention to position the probe leads 122–123. The circuitry 140 is shown with the selected probe placement points 304–305 marked with an "x" on the circuit 302. The probe lead 122 is first aligned with the probe placement point 304. The probe lead 123 is rotated by the rotational angle 400, and then the probe lead 123 is moved in a radial direction toward probe placement point 304 by a distance 402. As a result, the probe lead 123 is aligned with probe placement point 305. Both probe leads 122–123 would be engaged with their respective probe placement points 304–305 by moving the probe leads 122–123 into the drawing in the Z-direction.

Figure 5:
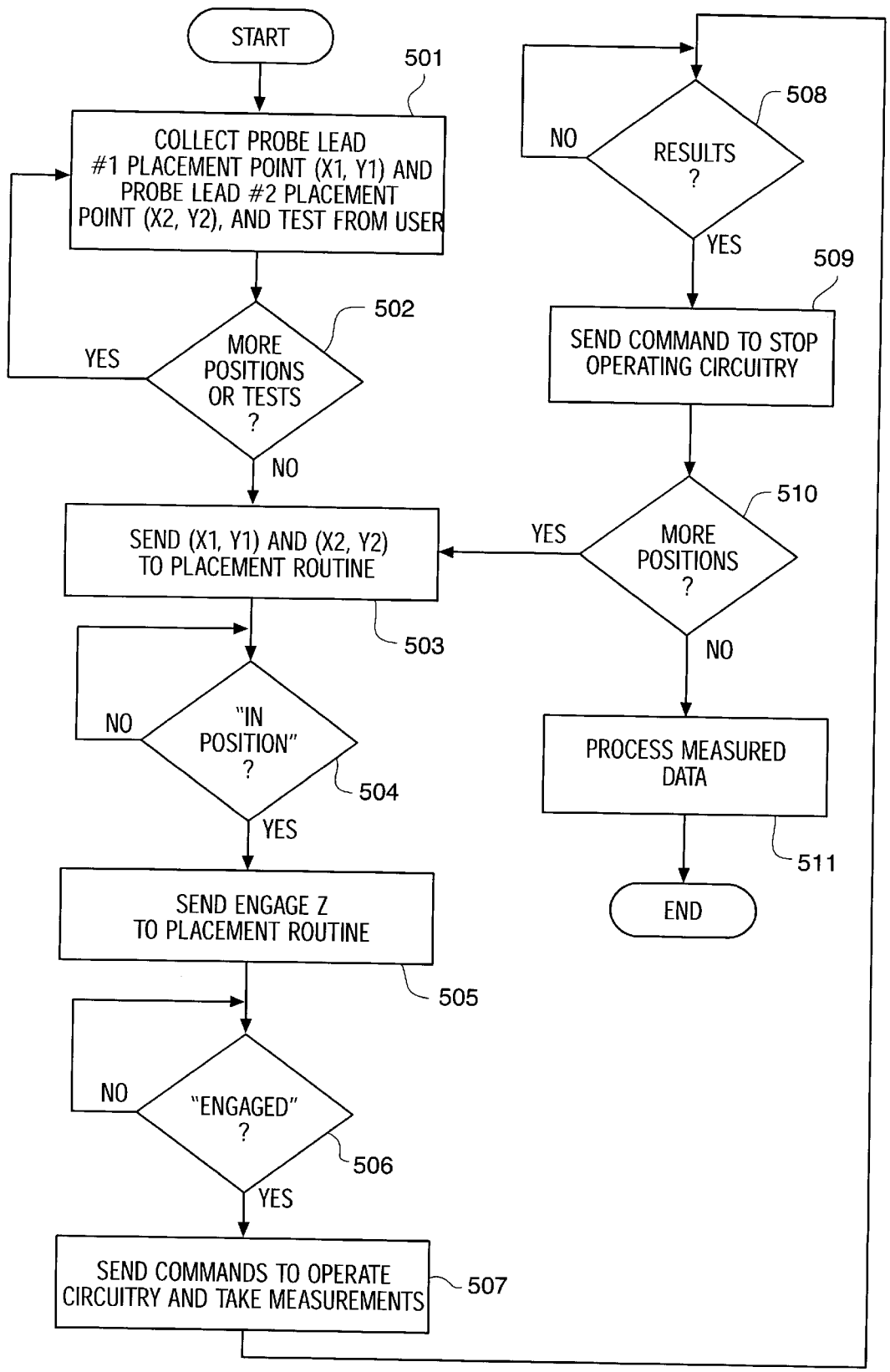
FIG. 5 is a flow diagram for control software in a version of the invention.
Figure 6:
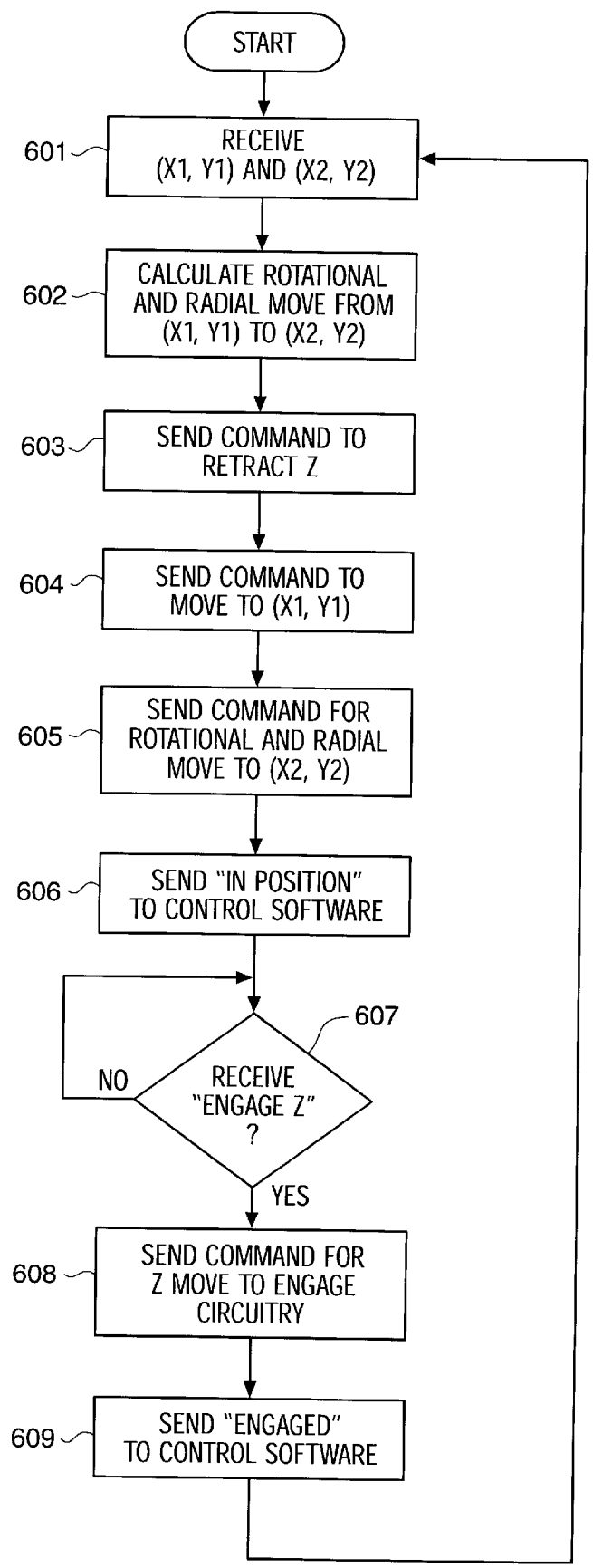
FIG. 6 is a flow diagram for a probe placement routine in a version of the invention.

Control Software FIGS. 5–6

FIG. 5 depicts a flow diagram of the control software in a version of the invention. At step 501, the software collects a placement point for the first probe lead (X1,Y1), a placement point for the second probe lead (X2,Y2), and the test for these placement points. If more probe positions or tests are desired by the user at step 502, the software collects these (X1,Y1) and (X2,Y2) placement points or tests until all probe placement points and tests are collected. At step 503, the first (X1,Y1) and (X2,Y2) placement points are sent to a probe placement routine. When an "in position" signal is returned from the probe placement routine at step 504, the software sends an "engage Z" command to the placement routine at step 505. When an "engaged" signal is received from the probe placement routine at step 506, the software commands the circuitry to operate and commands the probe to take measurements for the selected tests at step 507. When test results are received from the probe at step 508, the software commands the circuitry to stop operating at step 509. The control software then determines if there are more test positions at step 510. If there are no more test positions, the measurements are processed at step 511 and the process ends. If there are more test positions at step 510, the control software returns to step 503, and the (X1,Y1) and (X2,Y2) placement points for the next position are sent to the probe placement routine. Steps 503–510 repeat until all positions are tested.

FIG. 6 depicts a flow diagram for a placement routine in a version of the invention. The placement routine is a routine in the control software that receives probe placement points and directs the movement of the motors. The routine starts at step 601 when the (X1,Y1) and (X2,Y2) placement points are received from the control software. The routine calculates the rotational movement and the radial movement from the (X1,Y1) placement point to the (X2,Y2) placement point at step 602. The routine commands the Z motor to retract the probe leads at step 603. The routine commands the X-Y table to move probe lead #1 to (X1,Y1) at step 604. The routine commands the rotational motor and the radial motor to move probe lead #2 to (X2,Y2) at step 605. The routine sends an "in position" signal to the control software at step 606. When an "engage Z" command is received at step 607, the routine commands the Z motor to engage the probe leads with the circuitry at step 608. The routine sends an "engaged" signal to the control software at step 609, and the routine returns to step 601 for the next set of placement points.

The invention provides for the accurate placement of twin probe leads to facilitate circuitry testing. The robotic placement of twin probe leads minimizes the length of the leads, and as a result, minimizes the inductance and impedance that degrade testing performance. The use of robotics allows for repeated precision placement that is faster than manual placement and that avoids human error. Advantageously, the invention is capable of testing fully powered-up and operational circuit boards.

It can be appreciated that there are numerous variations of the above embodiments that are within the scope of the following claims. As a result, the invention should only be defined by the following claims and their appropriate equivalents.

What is claimed is:

1. A system for testing circuitry responsive to a user input wherein the system comprises:
    a probe comprising a first probe lead and a second probe lead that are operational to perform the testing responsive to a probe control signal;
    rotational positioning means for positioning the second probe lead in a rotational direction relative to the first probe lead responsive to a rotational control signal;
    radial positioning means for positioning the second probe lead in a radial direction relative to the first probe lead responsive to a radial control signal, wherein the radial positioning means is coupled to the rotational positioning means;
    Z-direction positioning means for positioning the first probe lead and the second probe lead in a Z-direction relative to the circuitry responsive to a Z-direction control signal, wherein the rotational positioning means is coupled to the Z-direction positioning means; and
    control means for generating and providing the rotational control signal to the rotational positioning means responsive to the user input, for generating and providing the radial control signal to the radial positioning means responsive to the user input, for generating and providing the Z-direction control signal to the Z-direction positioning means responsive to the user input, and for generating and providing the probe control signal to the probe responsive to the user input.

2. The system of claim 1 wherein the circuitry comprises a printed circuit board.

3. The system of claim 1 wherein the testing comprises signal integrity testing.

4. The system of claim 1 wherein:
    the rotational positioning means comprises a rotational motor and a hollow shaft, wherein the rotational motor is operational to rotate the hollow shaft, and wherein the first probe lead is centered in the hollow shaft; and
    the radial positioning means comprises a radial motor and a carriage, wherein the motor is operational to move the carriage along in a radial direction relative to the first probe lead, and wherein the second probe lead is fixed to the carriage.

5. The system of claim 1 further comprising:
    an X-Y-direction positioning means for positioning the first probe lead and the second probe lead in an X-Y direction relative to the circuitry responsive to an X-Y control signal, wherein the X-Y-direction positioning means is coupled to the Z-direction positioning means; and wherein;
    the control means is further for generating and providing the X-Y control signal to the X-Y-direction positioning means responsive to the user input.

6. The system of claim 1 wherein the probe comprises an active field effect transistor probe.

7. The system of claim 1 wherein the probe comprises a differential probe.

8. The system of claim 1 wherein the probe comprises a time domain reflectrometry probe.

9. The system of claim 1 wherein the probe comprises an RF probe.

10. The system of claim 1 wherein the probe comprises a shorting probe.

11. The system of claim 1 wherein the first probe lead and the second probe lead are comprised of pogo pins.

12. The system of claim 1 wherein the control means comprises a programmed computer.

13. The system of claim 1 wherein the control means is further for processing a computer-assisted design (CAD) file associated with the circuitry.

14. The system of claim 1 wherein the control means comprises a control computer and a remote terminal that are operationally connected through a communications link.

15. The system of claim 14 wherein the remote terminal is operational to display an image of the circuitry.

16. The system of claim 15 wherein the remote terminal is operational to collect a probe placement point from a user responsive to the displayed image of the circuitry.

17. The system of claim 14 wherein the remote terminal is operational to display testing results.

18. The system of claim 1 further comprising a camera that is coupled to the system.

19. The system of claim 1 wherein the system is operational to place the probe leads within 0.01 inches of probe placement points specified in the user input.

20. The system of claim 1 wherein the system is operational to place the probe leads within 0.001 inches of probe placement points specified in the user input.

21. A method for testing circuitry responsive to a user input wherein the method comprises:
    collecting the user input;
    providing a probe with a first lead and a second lead;
    generating a rotational control signal responsive to the user input and providing the rotational control signal to a rotational positioning system;
    generating a radial control signal responsive to the user input and providing the radial control signal to a radial positioning system;
    generating a Z-direction control signal responsive to the user input and providing the Z-direction control signal to a Z-direction positioning system;
    positioning the second probe lead in a rotational direction relative to the first probe lead with the rotational positioning system responsive to the rotational control signal;
    positioning the second probe lead in a radial direction relative to the first probe lead with the radial positioning system responsive to the radial control signal;
    positioning the first probe lead and the second probe lead in a Z-direction relative to the circuitry with the Z-direction positioning system responsive to the Z-direction control signal;
    generating a probe control signal and providing the probe control signal to the probe responsive to the user input; and
    performing the testing of the circuitry using the probe, the first probe lead, and the second probe lead responsive to the probe control signal.

22. The method of claim 21 wherein the circuitry comprises a printed circuit board.

23. The method of claim 21 wherein the testing comprises signal integrity testing.

24. The method of claim 21 wherein the testing comprises SPLICE model testing.

25. The method of claim 21 wherein:

the rotational positioning system comprises a rotational motor and a hollow shaft wherein the first probe lead is centered in the hollow shaft; and the radial positioning system comprises a radial motor and a carriage wherein the second probe lead is fixed to the carriage.

26. The method of claim 21 further comprising:

generating an X-Y-direction control signal responsive to the user input and providing the X-Y-direction control signal to an X-Y-direction positioning system; and positioning the first probe lead and the second probe lead in an X-Y-direction relative to the circuitry with the X-Y-direction positioning system responsive to the X-Y-direction control signal.

27. The method of claim 21 wherein generating the control signals further comprises processing a computer-assisted design (CAD) file associated with the circuitry.

28. The method of claim 21 wherein collecting the user input further comprises displaying an image of the circuitry at a remote terminal.

29. The method of claim 28 wherein collecting the user input further comprises collecting a probe placement point from a user responsive to displaying the image of the circuitry.

30. The method of claim 21 further comprising displaying testing results at a remote terminal.

31. The method of claim 21 wherein the positioning systems place the probe leads within 0.01 inches of probe placement points specified in the user input.

32. The method of claim 21 wherein the positioning systems place the probe leads within 0.001 inches of probe placement points specified in the user input.

* * * * *